United States Patent
Snedeker

(10) Patent No.: US 8,223,044 B2
(45) Date of Patent: Jul. 17, 2012

(54) INL CORRECTION CIRCUITRY AND METHOD FOR SAR ADC

(75) Inventor: Michael D. Snedeker, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 189 days.

(21) Appl. No.: 12/799,323

(22) Filed: Apr. 22, 2010

(65) Prior Publication Data

US 2011/0260899 A1     Oct. 27, 2011

(51) Int. Cl.
*H03M 1/06* (2006.01)
(52) U.S. Cl. ........................ 341/118; 341/155
(58) Field of Classification Search .................. 341/118, 341/120, 155, 110, 140, 172, 135
See application file for complete search history.

(56) References Cited

U.S. PATENT DOCUMENTS

| | | | |
|---|---|---|---|
| 7,196,645 B2 | 3/2007 | Bock | 341/120 |
| 7,501,965 B2 | 3/2009 | Janakiraman | 341/118 |
| 7,944,379 B2 * | 5/2011 | Ohnhaeuser et al. | 341/118 |
| 2007/0109168 A1 | 5/2007 | Hennessy et al. | |
| 2007/0132626 A1 | 6/2007 | Hurrell | |
| 2008/0186214 A1 | 8/2008 | Janakiraman | |
| 2010/0123611 A1 | 5/2010 | Cho et al. | |

OTHER PUBLICATIONS

PCT Search Report mailed Sep. 30, 2011.

* cited by examiner

*Primary Examiner* — Joseph Lauture
(74) *Attorney, Agent, or Firm* — John J. Patti; Wade J. Brady, III; Frederick J. Telecky, Jr.

(57) ABSTRACT

INL error in a SAR ADC (10) is reduced by providing correction capacitors (11B) each having a first terminal connected to a conductor (13) which is also connected to one terminal of the capacitors of a CDAC (11A) and to an input of a comparator (5) of the SAR ADC. Stored INL error information (18A) is utilized to control switches (32) coupled to second terminals of the correction capacitors to selectively couple them to either a ground voltage (GND) or a reference voltage ($V_{REF}$) in response to the stored INL error information so as to reduce the INL errors.

20 Claims, 7 Drawing Sheets

US 8,223,044 B2

INL CORRECTION CIRCUITRY AND METHOD FOR SAR ADC

BACKGROUND OF THE INVENTION

The present invention relates generally to correction of integral nonlinearity (INL) errors in SAR ADCs (successive approximation register analog to digital converters), particularly to INL errors caused by voltage coefficients of capacitors therein, and more particularly to improvements which avoid the need to use a complex math engine or computational circuitry to perform the INL corrections.

A SAR (successive approximation register) ADC (analog to digital converter) transforms an analog signal into a digital representation thereof by means of a binary algorithm which performs binary bit-by-bit comparisons after an input voltage is sampled onto a CDAC (capacitor digital to analog converter). This sampling stores charge in the CDAC that is manipulated and compared with a reference to determine a digital output code that most closely represents the analog input voltage.

Capacitors inherently have second order voltage coefficients that cause the amount of charge stored on a capacitor to be non-linear with respect to the voltage across the capacitor. Such voltage coefficients cause INL errors in the output of the ADC. As the analog input voltage being sampled in the ADC increases, the INL error due to the second order coefficient of the CDAC capacitors increases. Differences between an actual SAR ADC transfer curve and an "ideal" straight-line staircase transfer function caused by capacitor voltage coefficients are considered to be INL errors.

The magnitude of INL error in an ADC increases as the magnitude of the input signal increases. This increase in INL error is a result of the characteristic second order or "square law" relationship between the INL error due to the capacitor voltage coefficients of the CDAC capacitors and the voltage across them. Consequently, a doubling of the input voltage range will result in a quadrupled INL error. For example, if a 5 volt peak-to-peak input signal is applied to the SAR ADC and this results in generation of an INL error of 1 LSB, then a 10 volt peak-to-peak input signal would create an error of 4 LSBs at the input signal peak. The center point of a graph of the INL error may shift to either the left or right, based on the matching of the individual capacitors in the CDAC, and also based on whether or not the inputs are unipolar or bipolar (and also inherently based on the voltage coefficients since they are part of the cause of the INL error). The characteristic S-shape of the INL curve of a SAR ADC may be inverted, depending on the algorithm used for converting the input signal.

The closest prior art is believed to include commonly owned U.S. Pat. No. 7,501,965 entitled "Correcting for Errors that Cause Generated Digital Codes to Deviate from Expected Values in an ADC", issued Mar. 10, 2009 to S. Janakiraman, and also U.S. Pat. No. 7,196,645 entitled "Method and Compensation Device for Compensation of Characteristic Errors of an Analog-Digital Converter" issued Mar. 27, 2007 to Christian Bock.

Prior Art FIG. 1 herein is a copy of FIG. 6 of the '965 patent, which discloses a basic INL correction technique. Prior Art FIG. 2 herein is a copy of FIG. 7 of the '965 patent and discloses details of the CDAC 630 in Prior Art FIG. 1. Comparator 610 compares an intermediate signal (which is produced by CDAC 630 in response to $V_{IN}$ and auxiliary DAC 640) with a mid-level reference voltage to generate an input to SAR logic 626. Auxiliary DAC 640 receives a digital INL error signal computed by error computation block 625 and generates an analog representation of the INL error signal as an input to CDAC 630. The analog representation of the INL error signal is used to correct the analog output voltage produced by CDAC 630. SAR logic 626 performs a typical SAR algorithm to control computation block 625 and CDAC 630. The technique of the '965 patent uses the first few SAR ADC bit decisions of a conversion operation determine the part of the SAR ADC transfer function at which the present conversion process is occurring. Thus, the typical error caused by capacitive voltage coefficients of the CDAC capacitors is corrected before the SAR ADC conversion is finished.

The INL error correction performed in error computation block 625 of the '965 patent is performed by a complex "math engine" which computes various coefficients that are required to determine the INL error corrections in accordance with the complex process and associated equations described therein, and thereby provides a very precise correction for each individual SAR ADC chip. However, the use of the math engine results in the disclosed SAR ADC being undesirably complex, slow, and costly.

In some known CDACs, "dynamic error correction capacitors" are provided to correct for dynamic errors caused by signal voltage settling problems.

Thus, there is an unmet need for a way of inexpensively achieving fast correction of INL errors caused by capacitor voltage coefficients in a SAR ADC.

There also is an unmet need for a SAR ADC which avoids use of a complex mathematics engine to compute various coefficients to use for correction of INL errors during SAR ADC conversion processes.

There also is an unmet need for a simpler, faster way of achieving correction of INL errors due to voltage coefficients in a CDAC of a SAR ADC than is available in the prior art.

SUMMARY OF THE INVENTION

It is an object of the invention to provide a SAR ADC including simple, fast, and inexpensive INL error correction circuitry.

It is another object of the invention to provide a simpler, faster way of achieving correction of INL errors due to voltage coefficients in a CDAC of a SAR ADC than is available in the prior art.

It is another object of the invention to provide a SAR ADC including simple, fast, and inexpensive INL error correction circuitry for correcting INL errors caused by voltage coefficients of a CDAC in the SAR ADC.

It is another object of the invention to provide a SAR ADC which avoids use of a complex mathematics engine to compute various coefficients to use for correction of INL errors during SAR ADC conversion processes.

It is another object of the invention to provide a SAR ADC in which INL error correction is based on use of INL correction capacitors in or associated with a CDAC of the SAR ADC and on selection of the individual correction capacitors by using an INL error look-up table in response to the first few bit decisions of the SAR DAC conversion process.

It is another object of the invention to provide a SAR ADC which avoids using complicated analog circuitry and a mathematics engine to determine amounts of needed INL correction by using a simple digital decoder and associated INL error look-up table which stores statistical INL correction information corresponding to expected INL errors of the SAR ADC due to CDAC capacitor voltage coefficients.

Briefly described, and in accordance with one embodiment, the present invention provides a circuit and method by means of which INL error in a SAR ADC (10) is reduced, by providing correction capacitors (11B) each having a first terminal connected to a conductor (13) which is also connected to one terminal of the capacitors of a CDAC (11A) and to an input of a comparator (5) of the SAR ADC. Stored INL error information (18A) is utilized to control switches (32) coupled to second terminals of the correction capacitors to selectively couple them to either a ground voltage or a reference voltage ($V_{REF}$) in response to the stored INL error information so as to reduce the INL errors.

In one embodiment, the invention provides a SAR ADC (10) which includes a first CDAC (11A) receiving a first analog input signal ($V_{IN}^+$) and including a plurality of CDAC capacitors each having a first terminal coupled to a first conductor (13). A first correction capacitor circuit (11B) includes a correction capacitor having a first terminal coupled to the first conductor (13). A comparator (5) has a first input (+) coupled to the first conductor (13). SAR logic circuitry (18) has an input coupled to an output (6) of the comparator (5) and also has a first output bus (16) coupled to control a plurality of switches (32) coupled to second terminals of the capacitors of the first CDAC (11A), respectively, for selectively coupling the second terminals to either a first reference voltage (GND) or a second reference voltage ($V_{REF}$). The SAR logic circuitry (18) produces a digital signal (25) representative of the first analog input signal ($V_{IN}^+$). Decoder circuitry (18A) has a first output bus (24) coupled to control a switch (32) coupled to a second terminal of the correction capacitor (11B) to selectively couple the second terminal of the correction capacitor to either the first reference voltage (GND) or a third reference voltage ($V_{REF}$ or $V_{REF1}$ in FIG. 8) in response to stored INL error information so as to correct INL errors in a transfer characteristic of the SAR ADC.

In the described embodiments, the first correction capacitor circuit (11B) includes a plurality of the correction capacitors (11B). The first output bus (24) of the decoder circuitry (18A) is coupled to control a plurality of switches (32) coupled to second terminals of the correction capacitors, respectively, of the first correction capacitor circuit (11B). A second CDAC (7A) receives a second analog input signal ($V_{IN}^-$) and includes a plurality of CDAC capacitors each having a first terminal coupled to a second conductor (12) coupled to a second input (−) of the comparator (5). The SAR ADC (10) also includes a second correction capacitor circuit (7B) including a plurality of correction capacitors each having a first terminal coupled to the second conductor (12). The SAR logic circuitry (18) has a second output bus (14) coupled to control a plurality of switches (32) coupled to second terminals of the capacitors of the second CDAC (7A), respectively, for selectively coupling the second terminals of the capacitors of the second CDAC (7A) to either the first reference voltage (GND) or the second reference voltage ($V_{REF}$). The decoder circuitry (18A) has a second output bus (22) coupled to control a plurality of switches (32) coupled to the second terminals of the correction capacitors of the second correction capacitor circuit (7B) to selectively couple the second terminals of the correction capacitors of the second correction capacitor circuit (7B) to either the first reference voltage (GND) or the third reference voltage ($V_{REF}$ or $V_{REF1}$ in FIG. 8) in response to the stored INL error information, wherein the SAR logic circuitry (18) produces the digital signal (25) to represent a difference ($V_{IN}^+ - V_{IN}^-$) between the first ($V_{IN}^+$) and second ($V_{IN}^-$) analog input signals. The decoder (18A) is part of the SAR logic circuitry (18). The digital signal (25) is received by an output logic circuit (27) to format the digital signal (25) into a digital output signal (DOUT) of the SAR ADC (10).

In the described embodiments, capacitors of the first (11A) and second (7A) CDACs are binarily weighted, and the correction capacitors of the first (11B) and second (7B) correction capacitor circuits also are binarily weighted.

In one embodiment, the first conductor (13) is coupled to the first terminals of the capacitors of the first correction capacitor circuit (11B) and the first (+) input of the comparator (5) by means of a third conductor (13A) and a first scaling capacitor ($C_{SCALE}$ in FIG. 7) coupled between the first (13) and third (13A) conductors, and wherein the second conductor (12) is coupled to the first terminals of the capacitors of the second correction capacitor circuit (7B) and the second (−) input of the comparator (5) by means of a fourth conductor (12A) and a second scaling capacitor ($C_{SCALE}$ in FIG. 7) coupled between the second (12) and fourth (12A) conductors.

In one embodiment, a digital to analog converter (15) has an input (17) coupled to receive a digital input signal (SCALING CODE) for generating the third reference voltage ($V_{REF1}$).

In the described embodiments, the INL errors are caused primarily by voltage coefficients of the capacitors of the first (11A) and second (7A) CDACs.

In the described embodiments, the results of a predetermined number of initial bit decisions by the SAR logic (18) are utilized by the decoder (18A) to access a look-up table (Table 1) to determine which of the correction capacitors are to be selectively coupled to the third reference voltage ($V_{REF}$ or $V_{REF1}$).

In one embodiment, the look-up table (Table 1) stores statistically determined INL correction information for the SAR ADC.

In one embodiment, the invention provides a method for reducing INL error in a SAR ADC (10) which includes a CDAC (11A) receiving an analog input signal ($V_{IN}^+$), including a plurality of CDAC capacitors each having a first terminal coupled to a first conductor (13), a comparator (5) having a first input (+) coupled to the first conductor (13), and SAR logic circuitry (18) having an input coupled to an output (6) of the comparator (5) and also having a first output bus (16) coupled to control a plurality of switches (32) coupled to second terminals of the capacitors of the CDAC (11A), respectively, for selectively coupling the second terminals to either a first reference voltage (GND) or a second reference voltage ($V_{REF}$), the SAR logic circuitry (18) producing a digital signal (25) representative of the input signal ($V_{IN}^+$), wherein the method includes providing stored INL error information; coupling a first terminal of each of a plurality of correction capacitors in a correction capacitor circuit (11B) to the first conductor (13); and controlling switches (32) coupled to second terminals of each of the correction capacitors to selectively couple the second terminals of the correction capacitors, respectively, to either the first reference voltage (GND) or a third reference voltage ($V_{REF}$ or $V_{REF1}$ in FIG. 8) in response to the stored INL error information to correct INL errors in a transfer function of the SAR ADC (10).

In a described embodiment, the method includes utilizing results of a predetermined number of initial bit decisions by the SAR logic circuitry (18) to access a look-up table (Table 1) to determine which of the correction capacitors are to be selectively coupled to the third reference voltage ($V_{REF}$ or $V_{REF1}$). In a described embodiment, the method includes storing statistically determined INL correction information for the SAR ADC in the look-up table (Table 1). The method also includes determining the INL error by subtracting an actual transfer function for the SAR ADC (10) from an ideal transfer function for the SAR ADC. In one embodiment, the method includes generating the third reference voltage ($V_{REF1}$) by means of a digital to analog converter (15) having an input (17) coupled to receive a digital input signal (SCALING CODE).

In one embodiment, the method includes circuitry for reducing INL error in a SAR ADC (10) which includes a CDAC (11A) receiving an analog input signal ($V_{IN}^+$), including a plurality of CDAC capacitors each having a first terminal coupled to a first conductor (13), a comparator (5) having a first input (+) coupled to the first conductor (13), and SAR logic circuitry (18) having an input coupled to an output (6) of the comparator (5) and also having a first output bus (16) coupled to control a plurality of switches (32) coupled to second terminals of the capacitors of the CDAC (11A), respectively, for selectively coupling the second terminals to either a first reference voltage (GND) or a second reference voltage ($V_{REF}$), the SAR logic circuitry (18) producing a digital signal (25) representative of the input signal ($V_{IN}^+$), the circuitry including first correction capacitor means (11B) for coupling a first terminal of each of a plurality of correction capacitors in a correction capacitor circuit (11B) to the first conductor (13); means (Table 1,18A) for storing INL error information; and means (18A) for controlling switches (32) coupled to second terminals of each of the correction capacitors to selectively couple the second terminals of the correction capacitors, respectively, to either the first reference voltage (GND) or a third reference voltage ($V_{REF}$ or $V_{REF1}$) in response to the stored INL error information to correct INL errors in a transfer function of the SAR ADC (10).

DETAILED DESCRIPTION OF THE PREFERRED EMBODIMENTS

Figure 1:
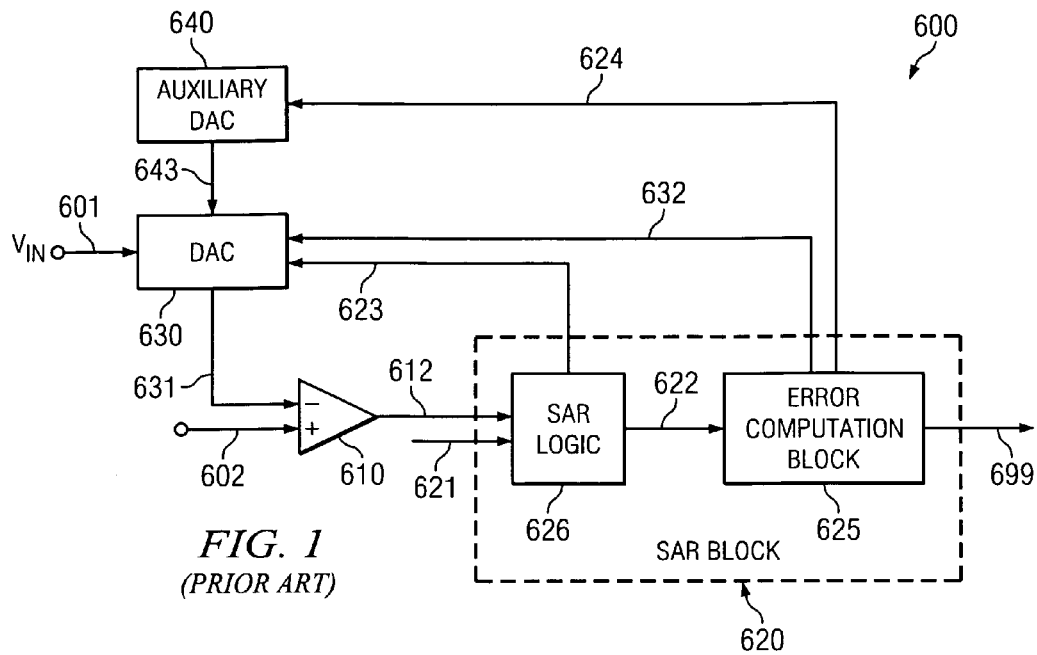
FIG. 1 is a schematic diagram of an analog to digital converter including prior art INL error correction circuitry.
Figure 2:
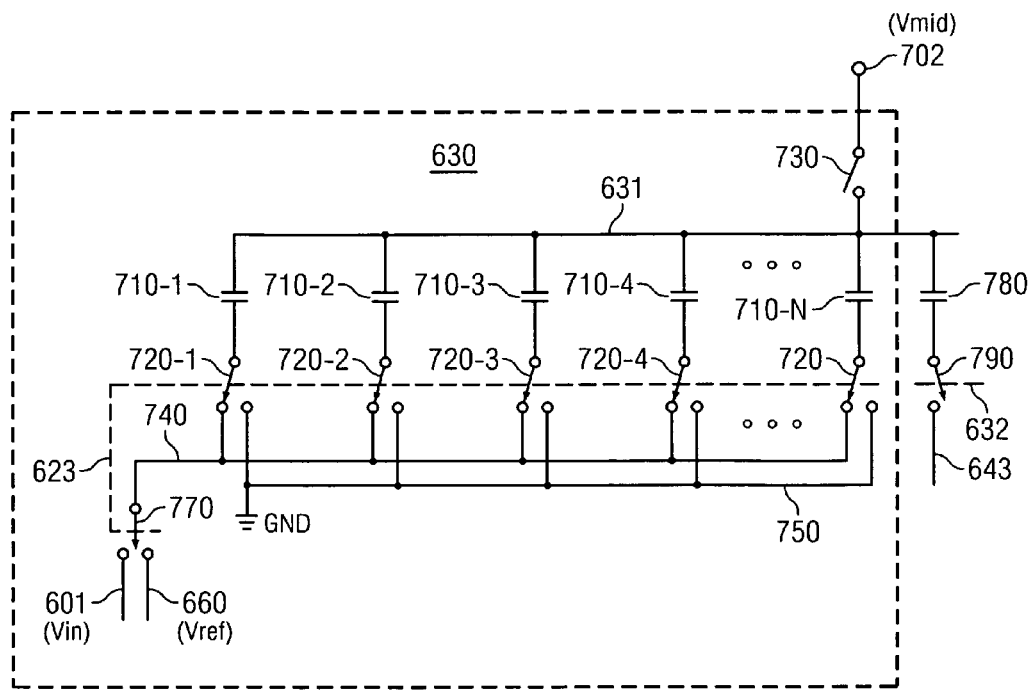
FIG. 2 is a schematic diagram of block 620 in FIG. 1.
Figure 3:
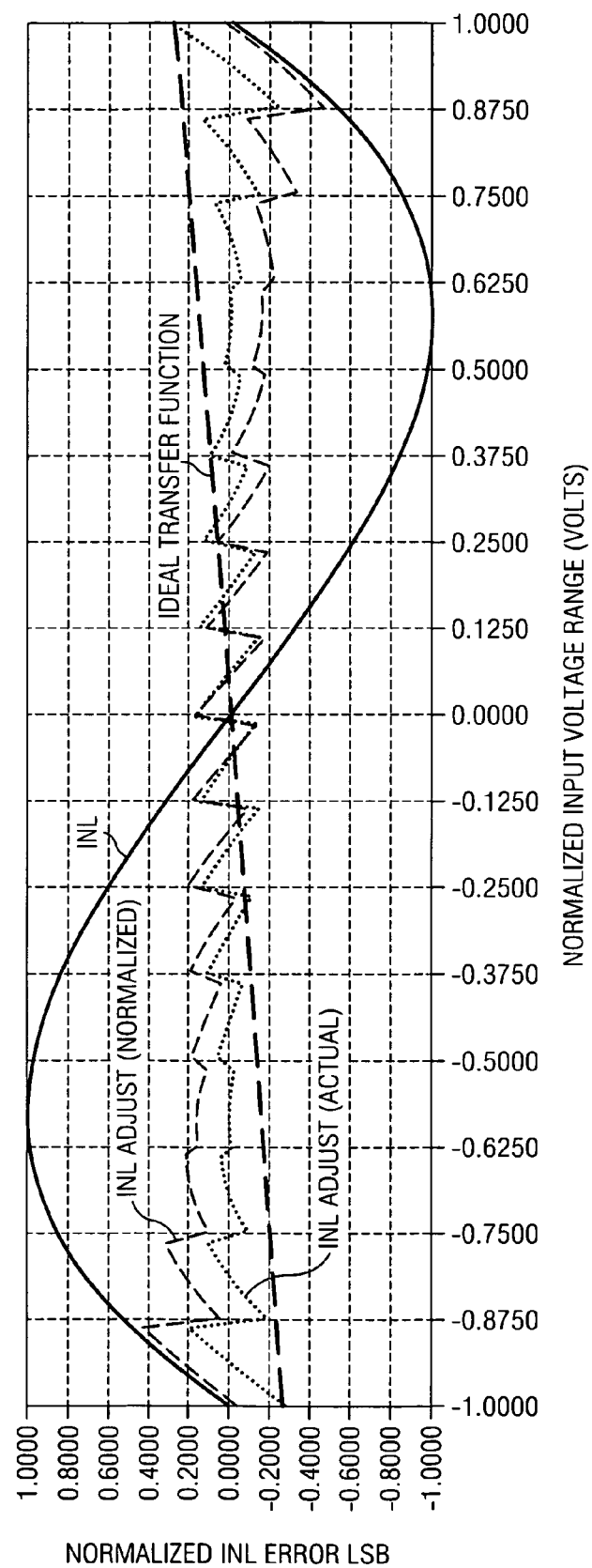
FIG. 3 is a diagram illustrating a typical INL characteristic curve and an INL correction curve according to the present invention.

An ideal SAR ADC transfer function is a straight line or linear staircase function that relates analog input voltage of the SAR ADC to a digital representation thereof. INL errors (integral nonlinearity errors) in the transfer function due to capacitor voltage coefficients of a CDAC in the SAR ADC cause the actual transfer function thereof to differ from its ideal transfer function. The differences from the ideal transfer function can be indicated by a characteristic S-shaped INL error curve as shown in FIG. 3. The INL curve has a characteristic S-shape that is observed for the integral nonlinearity of a SAR ADC due to the voltage coefficients of its CDAC capacitors. The INL error curve is obtained by subtracting the ideal linear transfer curve from the actual transfer curve.

The characteristic S-shape of the INL error curve is caused by the second order capacitor voltage coefficients. The INL error curve is obtained by, in effect, drawing a straight line from the endpoints of the actual SAR ADC transfer function and then subtracting the actual transfer function from the ideal straight line transfer function. The drawing of the line makes any changes in the first and last segment transparent to the end result.

A third-order polynomial equation was used to provide a simple representation of the INL curve shown in FIG. 3, although a more complex, and therefore more accurate, equation could be used instead. In any case, the amount of needed INL correction to be represented by the equation must first be determined by segmenting the INL curve. A limitation of the correction comes from the largest error within the first and last segment, as no correction can be done in these segments.

Figure 4:
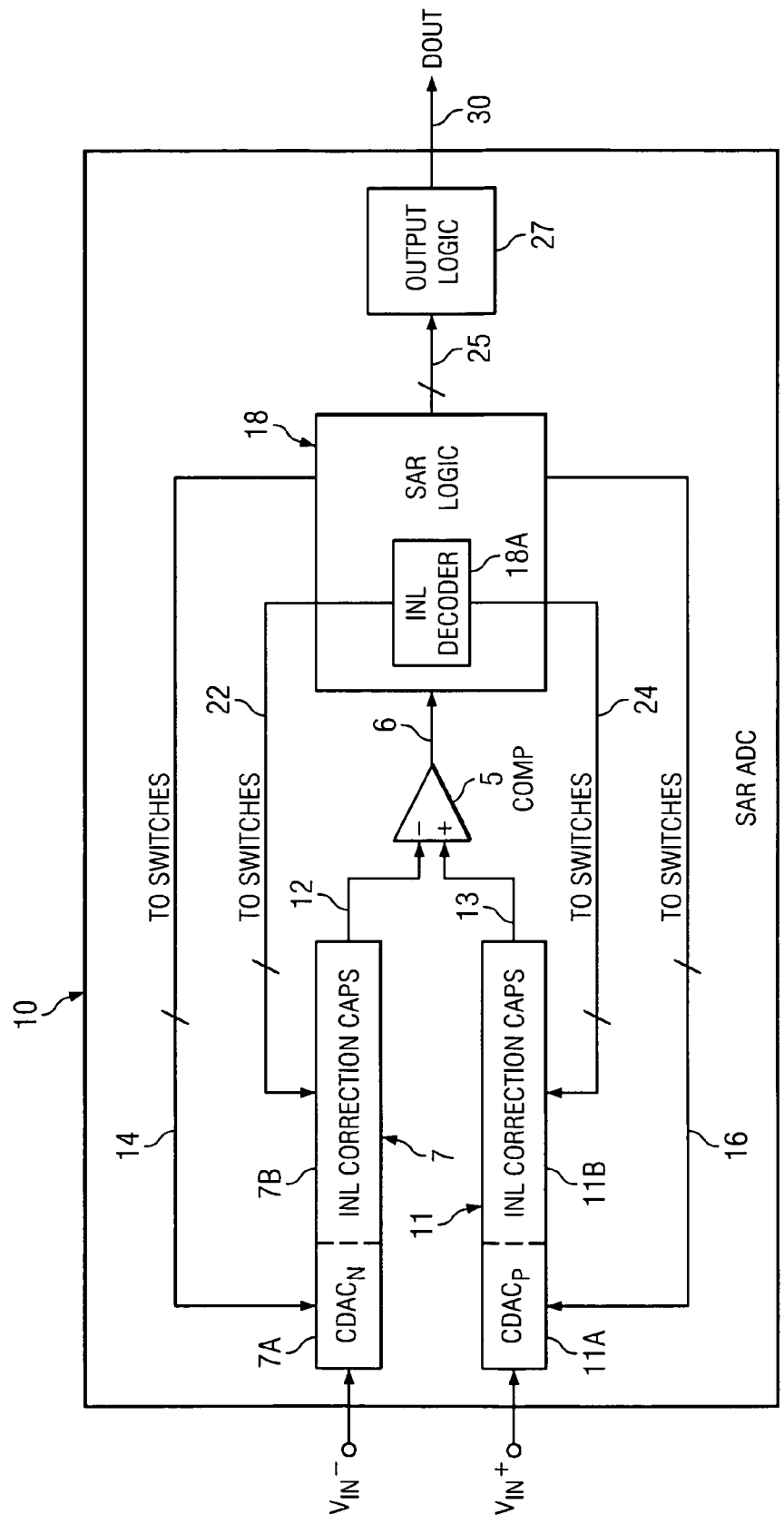
FIG. 4 is a block diagram of a SAR ADC including INL correction capacitors and associated circuitry in accordance with the present invention.
Figure 5:
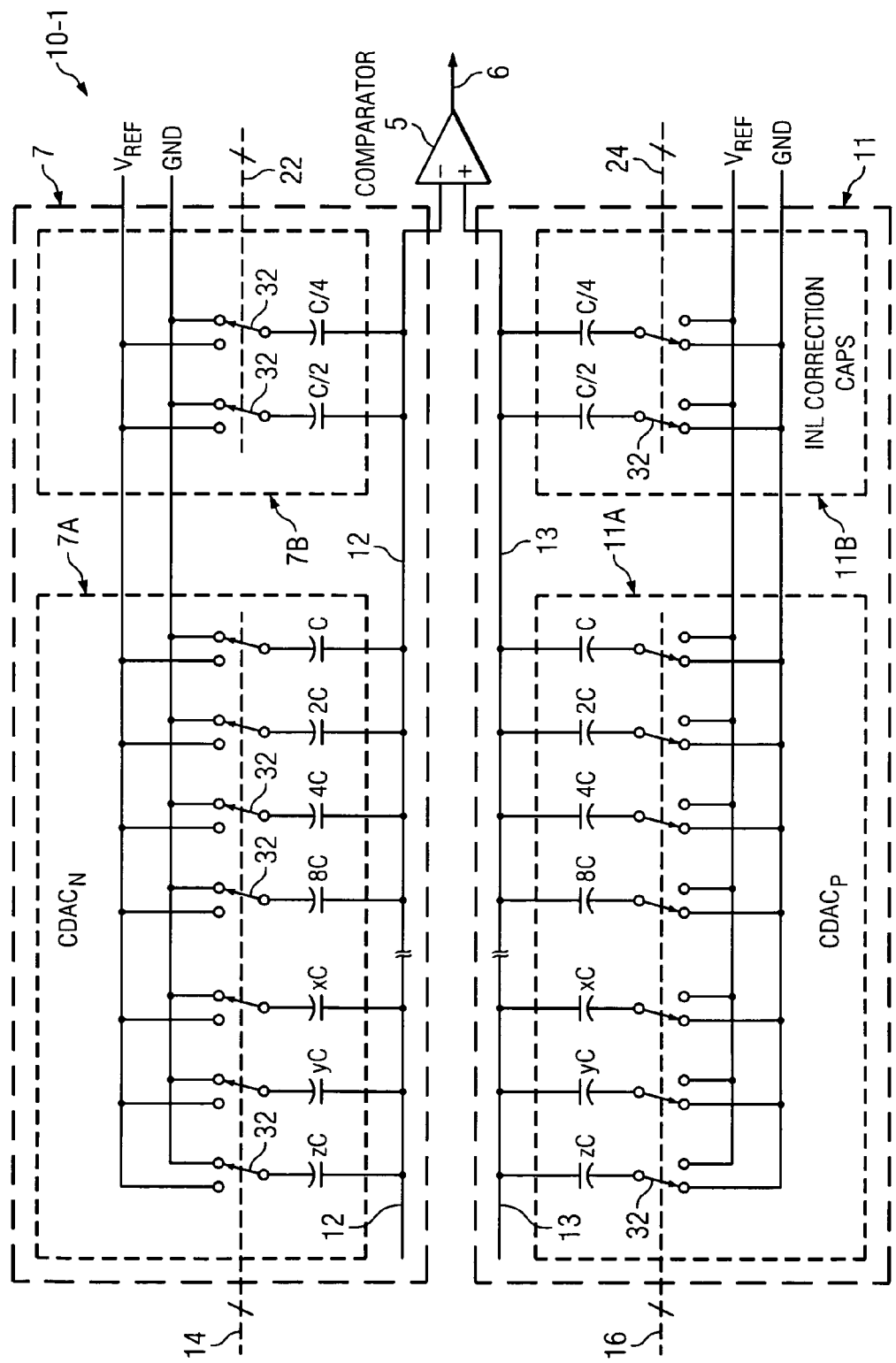
FIG. 5 is a schematic diagram of an implementation of the SAR ADC of FIG. 4 including four INL correction capacitors.

In the graph of FIG. 3, the simulated S-shaped curve designated "INL" represents integral nonlinearity errors caused by the voltage coefficients of the capacitors in a CDAC of a SAR ADC. The vertical axis in the graph of FIG. 3 indicates normalized INL error expressed in LSBs (least significant bits), and therefore implicitly in volts. Each LSB has an associated "LSB size" which is equal to the amount of input voltage change needed to cause the least significant bit of the digital output signal DOUT (FIG. 4) to switch from a "0" to a "1" or vice versa. The value of the maximum INL error voltage depends on the reference voltage being used and the range of the applied input voltage. The "LSB size" depends on the configuration or architecture of the CDAC. The vertical axis of the INL curve in FIG. 3 is normalized so that the maximum error is equivalent to exactly one LSB. The "NORMALIZED INPUT VOLTAGE RANGE" indicated on the horizontal axis in FIG. 3 indicates the range of a bipolar input voltage of the SAR ADC. Note that on the horizontal axis of FIG. 3, actual binary codes are not indicated because they have been normalized to ±1 volt. The "INL ADJUST (NORMALIZED)" curve in FIG. 3 is a simulated "corrected" INL error for the SAR ADC shown in FIGS. 4 and 5, resulting from switching of the INL correction capacitors to $V_{REF}$ for the case in which in the CDAC circuitry 10-1 in FIG. 5 is provided for blocks 5, 7, and 11 in FIG. 4. The INL correction capacitors of the present invention are used to provide the reduced INL errors indicated in the simulated INL ADJUST (NORMALIZED) curve. The INL ADJUST (NORMALIZED) curve indicates a greatly reduced amount of INL error in the SAR ADC transfer function compared to the amount of uncorrected (i.e., S-shaped) INL error, as a result of using the INL correction capacitor technique of the present invention.

In FIG. 3, the INL ADJUST(NORMALIZED) curve is obtained from the INL ADJUST(ACTUAL) curve and the IDEAL TRANSFER FUNCTION curve. Note that the left and right end points of the INL ADJUST(NORMALIZED) curve both are at 0 LSB on the vertical axis. When the actual corrected INL error curve is obtained by subtracting the corresponding actual ideal linear transfer function of the SAR ADC from the actual SAR ADC transfer function when the INL correction circuitry shown in the example of FIGS. 4 and 5 is used, the result is the INL ADJUST(ACTUAL) curve shown in FIG. 3. Note that its calculated end points are not at 0 LSB. Therefore, the IDEAL TRANSFER FUNCTION curve is obtained by, in effect, drawing a straight line through the left and right end points of the IDEAL TRANSFER FUNCTION curve. Then the IDEAL TRANSFER FUNCTION and the INL ADJUST(ACTUAL) are, in effect, "normalized" by raising the left end point of the IDEAL TRANSFER FUNCTION to 0 LSB and lowering the right end point to 0 LSB. The amount that each point of the IDEAL TRANSFER FUNCTION curve is shifted is used to equally shift the corresponding point of the INL ADJUST(ACTUAL) curve, and that shifting results in the INL ADJUST(NORMALIZED) curve.

In FIG. 4, SAR ADC 10 includes a CDAC 11 which includes both a CDAC 11A and a plurality of INL correction capacitors in block 11B. The input voltage $V_{IN}^+$ is applied to an input of CDAC 11A. The output 13 of CDAC 11 is connected to the (+) input of a comparator 5, the output of which is connected to an input of SAR logic 18. SAR ADC 10 also includes a CDAC 7 which includes both a CDAC 7A and a plurality of INL correction capacitors in block 7B. The input voltage $V_{IN}^-$ is applied to an input of CDAC 7A. The output 12 of CDAC 7 is connected to the (−) input of comparator 5. (Note that the relationship of $V_{IN}^+$ and $V_{IN}^-$ with respect to the connectivity of the (+) and (−) inputs of comparator 5 can be reversed and compensated for within SAR logic 18.)

Details of an implementation of CDACs 7 and 11 from which the INL and INL ADJUST (NORMALIZED) curves of FIG. 3 are simulated are shown in FIG. 5. Referring to FIG. 5, circuitry 10-1 may be used for implementation of CDACs 7A and 11A and INL correction capacitors blocks 7B and 11B in FIG. 4. (The INL correction capacitors 7B and 11B in FIG. 4 may be considered to be part of the CDACs 7 and 11, respectively.) In CDAC 11A of FIG. 5, each of a number of binarily weighted CDAC capacitors of capacitance C, 2C, 4C, 8C ... xC, yC, and zC, respectively, has its upper terminal connected by conductor 13 to the (+) input of comparator 5. The lower terminal of each of those CDAC capacitors is connected to the wiper of a corresponding switch 32 having one terminal connected to ground (GND) and another terminal connected to $V_{REF}$. Similarly, in CDAC 7A, each of a number of binarily weighted CDAC capacitors of capacitance C, 2C, 4C, 8C ... xC, yC, and zC, respectively, has its lower terminal connected by conductor 12 to the (−) input of comparator 5. The upper terminal of each CDAC capacitor in CDAC 7A is connected to the wiper of a corresponding switch 32 having one terminal connected to ground and another terminal connected to $V_{REF}$. The control electrodes of the switches 32 in CDAC 11A are connected to corresponding conductors of bus 16 in FIG. 4, and the control electrodes of the switches 32 in CDAC 7A are connected to corresponding conductors of bus 14 in FIG. 4.

FIG. 5 also shows the circuitry for the INL correction capacitors in blocks 7B and 11B of FIG. 4. In block 7B of FIG. 5, each of two INL correction capacitors of capacitance C/4 and C/2 has its upper terminal connected to conductor 12 and its lower terminal connected to the wiper of a corresponding switch 32 having one terminal connected to ground and another terminal connected to $V_{REF}$. Similarly, in block 11B of FIG. 5, each of two INL correction capacitors of capacitance C/4 and C/2 has its lower terminal connected to conductor 13 and its upper terminal connected to the wiper of a corresponding switch 32 having one terminal connected to ground and another terminal connected to $V_{REF}$.

The control electrodes of the switches 32 in block 11B are connected to corresponding conductors of a bus 24 from INL decoder 18A (FIG. 4), and similarly, the control electrodes of the switches 32 in block 7B are connected to corresponding conductors of a bus 22 (FIG. 4). In this example, the correction capacitor values in FIG. 5 are scaled to have values which correspond to 0.5 and 0.25 LSBs. This allows three INL corrective values 0.25, 0.5, and 0.75 LSBs to be provided to either the (+) or (−) input of comparator 5 (where an LSB is defined as having a value that corresponds to one capacitance value C). The configuration shown in FIGS. 4 and 5 was used for generating the simulated INL and INL ADJUST (NORMALIZED) curves in FIG. 3 for the case of a 12-bit SAR ADC. (The graphs in FIG. 3 are normalized, and actually are applicable to any SAR ADC of more than 8 bits.)

The INL ADJUST (NORMALIZED) curve in FIG. 3 indicates how selected amounts of segmented INL correction can be used to correct INL errors by, in effect, adding selected amounts of INL correction capacitance to the capacitance of CDAC 7A or CDAC 11A as an initial number of bit decisions (e.g., 5 bit decisions) are made in the process of the present SAR ADC conversion. Corresponding correction values are thereby determined and superimposed onto conductor 12 of CDAC 7A or conductor 13 of CDAC 11A of FIG. 5 to correct for the expected statistical INL error. In the example of FIGS. 4 and 5, a correction is applied to conductor 12 or conductor 13 after the first five decisions have been made. (However, note that using the results of more initial bit decisions to determine how much INL error correction is needed yields more accurate INL correction results.) Using the 5 bits to evaluate the "location" of the transfer function at which the sample is located provides 32 possible INL error correction values.

The turning "ON" of INL correction capacitors 11A (e.g., as indicated in subsequently described Table 1) is accomplished by connecting them to $V_{REF}$ through corresponding switches 32 and conductor 13 to the (+) input of comparator 5. This causes the effective stored charge in CDAC 11 to increase, thus increasing the SAR ADC output code value on bus 25 (which, except for data format, is exactly the same as DOUT on bus 30. Similarly, turning INL correction capacitors 7A "ON" by connecting them through corresponding switches 32 and conductor 12 to the (−) input of comparator 5 causes the effective stored charge in CDAC 11 to decrease, thus decreasing the SAR ADC output code value.

During sampling of the differential input voltage $V_{IN}^+ - V_{IN}^-$ to store corresponding amounts of charge in the capacitors of CDACs 11A and 7A, the INL correction capacitors are coupled to a ground reference voltage (GND). Subsequently, selected correction capacitors are switched to $V_{REF}$ in order to make an appropriate INL correction on conductor 13 or conductor 12. (Note that this process could be reversed, ie. the correction capacitors could be sampled to $V_{REF}$ and switched to ground to make an adjustment. However, the look-up table would have to be adjusted to allow for this.) Since SAR ADC 10 makes the bit decisions sequentially, the results of the most significant or upper bit decisions can be used to determine the portion or location of the SAR ADC transfer function in which present conversion is occurring. With this information, the correction capacitors in block 7B are connected to conductor 12 along with the capacitors of CDAC 7A or the correction capacitors in block 11B are connected to conductor 13 along with the capacitors of CDAC 11A and therefore are, in effect, added to or superimposed onto CDAC 11A or CDAC 7A, respectively, for the purpose of correcting INL errors in the manner determined by subsequently described INL decoder 18A and its associated implementation of subsequently described Table 1. The magnitude of the INL correction occurs as a number of LSBs or "LSB sizes" according to the statistically expected INL errors, and is adjusted with respect to the input signal range.

In FIG. 4, SAR logic 18 includes conventional SAR logic and register circuitry, and also includes INL decoder 18A to control which INL correction capacitors are turned ON (i.e., connected to a reference voltage $V_{REF}$) during a conversion process. One output of SAR logic 18 is coupled by a group of conductors or digital bus 14 to the control terminals of various switches of CDAC 7A which operate to connect the various binarily weighted capacitors in block 7A to either ground or $V_{REF}$ in accordance with execution of a conventional SAR algorithm performed by SAR logic 18. Similarly, another output of SAR logic 18 is coupled by a group of conductors or bus 16 to the control terminals of various switches of CDAC 11A which operate to connect the various binarily weighted capacitors in block 11A to either ground or $V_{REF}$ in accordance with the SAR algorithm.

One output of INL decoder 18A is connected by a group of conductors 22 to control terminals of various switches which operate to connect individual correction capacitors in block 7B either to ground or $V_{REF}$ in accordance with the INL error correction process of the present invention. Similarly, another output of INL decoder 18A is connected by a group of conductors 24 to control terminals of various switches which operate to connect individual correction capacitors in block 11B either to ground or $V_{REF}$ in accordance with the INL error correction process of the present invention.

The output of SAR logic 18 is coupled by digital bus 25 to the input of output logic 27, which converts the contents of the SAR registers in SAR logic 18 to a serial or parallel digital output word DOUT.

Various implementations of INL decoder 18A can be used. For example, a simple hard-wired look-up table can be used, in conjunction with a multiplexer. Based on the results of the first 5 most significant bit decisions by SAR logic 18, INL decoder 18A selects which INL correction capacitors 11B or 7B are to be turned ON. The first bit decision indicates whether the SAR ADC conversion process is operating in the positive or negative portion of S-shaped INL error curve in FIG. 3 and hence whether correction capacitors in block 7B or 11B are to be turned ON (by connecting them to $V_{REF}$) in order to reduce the INL error. The next four bit decisions indicate which of the INL correction capacitors on that side (i.e., the (+) side or the (−) side) of the CDAC circuitry will superimpose an incremental amount of INL error correction charge and voltage on an input (either conductor 12 or conductor 13) of comparator 5. For the first half of the SAR ADC transfer function corresponding to the left side of FIG. 3, the INL error is subtracted to correct the actual INL error and for the other half of the INL transfer function corresponding to the right side of FIG. 3 an error amount is added to correct the actual INL error. (Note that the polarity the S-shape of the INL curve could be reversed, in which case the above mentioned subtraction and addition of INL error would also have to be reversed.)

After the first five bit decisions have been made by SAR logic 18, INL decoder 18A is activated and decodes, for example, the MSB bit results of the 5 most significant bit decisions and uses that information to determine the polarity and amount of INL error correction that needs to be made in response to information from the look-up table represented by Table 1. INL decoder 18A then, in effect, accordingly turns various correction capacitors ON in order to superimpose appropriate amounts of incremental INL correction charge (and voltage) on conductor 12 or conductor 13.

Thus, after allowing the resulting voltage on conductor 12 or conductor 13 to settle, SAR logic 18 continues executing the SAR ADC conversion algorithm. Output logic circuitry 27 receives the digital output code signal 25 from SAR logic 18 and converts it to a desired format, e.g., serial format, parallel format, etc.

As previously mentioned, "dynamic error correction capacitors" are used in some CDACs to correct for dynamic errors caused by signal voltage settling problems. (Dynamic errors can be introduced during any of the bit decisions. Typically, the most significant bits are where most dynamic errors are introduced and where the most settling time is needed.) If such dynamic error correction capacitors are present, then the INL correction of the present invention should be applied before the last of such dynamic error correction capacitors is utilized in SAR logic 18. The dynamic error correction operation should be performed prior to at least one error correction bit operation of the present invention, so that if any additional errors are introduced during the conversion they can be compensated.

As previously mentioned, INL decoder 18A may include a hard-wired look-up table including the information indicated in Table 1 shown below, and may include conventional multiplexing or addressing circuitry for accessing look-up Table 1. In Table 1, the first five MSB decision bits are the result of the first five MSB bit decisions, starting with the result 00000. Bit decision result 00000 represents the normalized −1.0000 normalized value of the "INPUT VOLTAGE RANGE" value on the horizontal axis shown in FIG. 3. Similarly, bit decision result 11111 represents the normalized 1.0000 value of the "INPUT VOLTAGE RANGE" on the horizontal axis in FIG. 3.

TABLE 1

| Decision Bits | | | | | INL Correction Caps | | | |
|---|---|---|---|---|---|---|---|---|
| | | | | | PC/2 | PC/4 | NC/2 | NC/4 |
| 0 | 0 | 0 | 0 | 0 | | | | |
| 0 | 0 | 0 | 0 | 1 | | | ON | |
| 0 | 0 | 0 | 1 | 0 | | | ON | |
| 0 | 0 | 0 | 1 | 1 | | | ON | ON |
| 0 | 0 | 1 | 0 | 0 | | | ON | ON |
| 0 | 0 | 1 | 0 | 1 | | | ON | ON |
| 0 | 0 | 1 | 1 | 0 | | | ON | ON |
| 0 | 0 | 1 | 1 | 1 | | | ON | ON |
| 0 | 1 | 0 | 0 | 0 | | | ON | ON |
| 0 | 1 | 0 | 0 | 1 | | | ON | ON |
| 0 | 1 | 0 | 1 | 0 | | | ON | ON |
| 0 | 1 | 0 | 1 | 1 | | | ON | ON |
| 0 | 1 | 1 | 0 | 0 | | | ON | |
| 0 | 1 | 1 | 0 | 1 | | | ON | |
| 0 | 1 | 1 | 1 | 0 | | | | ON |
| 0 | 1 | 1 | 1 | 1 | | | | |
| 1 | 0 | 0 | 0 | 0 | | | | |
| 1 | 0 | 0 | 0 | 1 | | ON | | |
| 1 | 0 | 0 | 1 | 0 | ON | | | |
| 1 | 0 | 0 | 1 | 1 | ON | | | |
| 1 | 0 | 1 | 0 | 0 | ON | ON | | |
| 1 | 0 | 1 | 0 | 1 | ON | ON | | |
| 1 | 0 | 1 | 1 | 0 | ON | ON | | |
| 1 | 0 | 1 | 1 | 1 | ON | ON | | |
| 1 | 1 | 0 | 0 | 0 | ON | ON | | |
| 1 | 1 | 0 | 0 | 1 | ON | ON | | |
| 1 | 1 | 0 | 1 | 0 | ON | ON | | |
| 1 | 1 | 0 | 1 | 1 | ON | ON | | |
| 1 | 1 | 1 | 0 | 0 | ON | ON | | |
| 1 | 1 | 1 | 0 | 1 | ON | | | |
| 1 | 1 | 1 | 1 | 0 | ON | | | |
| 1 | 1 | 1 | 1 | 1 | | | | |

The INL ADJUST (NORMALIZED) correction levels for various input voltage ranges can be provided by simply adjusting the look-up table to select various combination of the INL correction capacitors in blocks 11B and 7B. Additional INL correction capacitors, i.e., more than the four correction capacitors shown in FIG. 5, may be provided to allow corrections of larger INL errors for a larger range of reference voltages This is helpful when larger input voltages are applied to the input of ADC SAR 10. Typically, the higher the input voltage, the greater the INL error will be, since the magnitude of the INL error is a square-law function of the input voltage.

Figure 6:
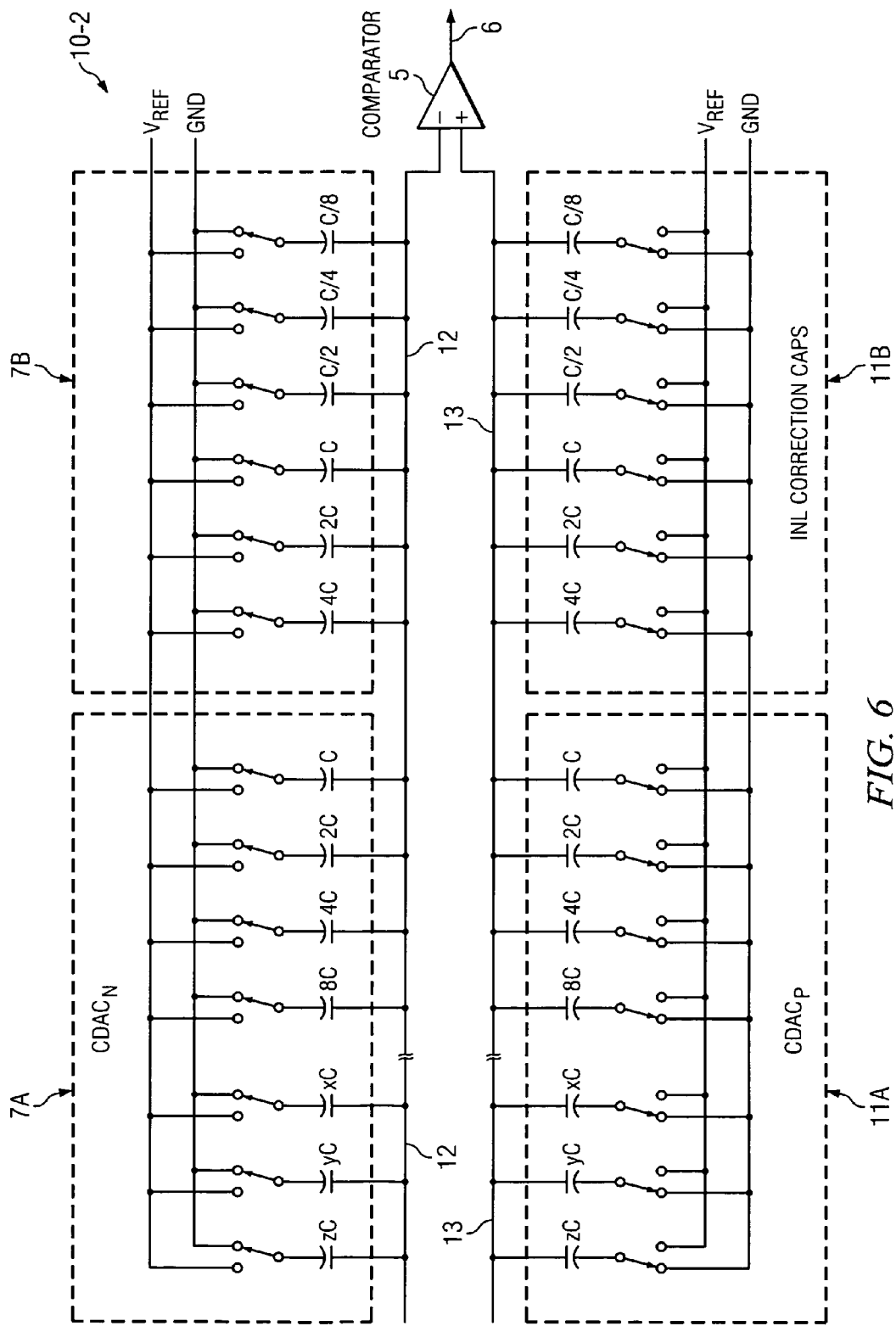
FIG. 6 is a schematic diagram of an implementation of the SAR ADC of FIG. 4 including 12 INL correction capacitors.

For example, if the input signal range is ±10 volts, the maximum INL error for that SAR ADC will be 8 LSBs. The configuration using the 12 INL correction capacitors shown in FIG. 6 can correct up to 8 LSBs of INL error. However, if the range of the input signal is reduced to ±5 volts, the input range has been reduced by half, then this has the effect of reducing the INL error range by a factor of 4. Then, the INL error range of 8 LSBs is reduced to 2 LSBs. In that case, the correction capacitors of capacitance 4 C and 2C shown in FIG. 6 are not needed for the INL correction. Therefore, Table 1 can be adjusted to use only the lower value INL correction capacitors in this case. Preferably, however, the higher valued INL correction capacitors are included in blocks 11B and 7B to allow the Table 1 to be adjusted for the worst possible expected INL errors.

INL decoder 18A (FIG. 4) can be expanded to adjust for different input voltage ranges. Larger amounts of error can be corrected by adding two more correction capacitors to each CDAC. The INL and INL ADJUST (NORMALIZED) curves in FIG. 3 assume a fixed input voltage range. However, if this fixed input voltage range is doubled, then the error increases from 1 LSB to 4 LSBs. By adding the above mentioned two additional compensation capacitors with values of 1.0 and 2.0 LSBs, respectively, to each of CDACs 7B and 11B as shown in FIG. 6, the additional errors can be corrected.

In FIG. 3, if the normalized input voltage range is ±1.000 volts, it can be seen that a value of normalized input voltage roughly between 0.5 and 0.6 on the horizontal axis occurs for the worst-case INL error of 1.0 LSB on the vertical axis. More specifically, if the value of normalized input voltage is −0.55 volts, then the INL curve indicates 1 LSB of INL error, based on the observed statistical performance of the particular design of the SAR ADC. Thus, the INL curve indicates the "location" in the SAR ADC conversion process at which the maximum amount of INL error correction is needed. The first two bit decisions occur in the part of the normalized input voltage range in which such maximum correction is needed. Once the conversion of the first 2 capacitors has been performed, i.e., once the first two bit decisions have been made, those two bit decisions indicate roughly where the input voltage is within the input voltage range.

The simulated INL curve shown in FIG. 3 shows statistical, uncorrected, and normalized integral nonlinearity error curve values, with a maximum of 1.000 LSB and a minimum of −1.000 LSB. In contrast, the corrected error indicated by the INL ADJUST (NORMALIZED) curve has a normalized maximum value of 0.250 LSB and a normalized minimum value of −0.250 LSB, which is much less than the normalized INL curve maximum value of exactly 1.000 LSB and a normalized minimum value of −1.000.

Thus, the INL error correction process of the present invention reduces the INL error by a factor of approximately 4 in this example wherein the four correction capacitors shown in blocks 7B and 11B FIG. 5 are used in blocks 7B and 11B of FIG. 4.

The circuitry 10-2 in FIG. 6 is essentially the same as the circuitry 10-1 in FIG. 5. However, circuitry 10-2 includes 6 INL binarily weighted INL correction capacitors of capacitance C/8, C/4, C/2, C, 2C, and 4C, respectively, in block 11B connected by conductor 13 to the (+) input of SAR comparator 5. Circuitry 10-2 in FIG. 6 also includes 6 INL binarily weighted INL correction capacitors of capacitance C/8, C/4, C/2, C, 2C, and 4C, respectively, in block 7B connected by conductor 12 to the (−) input of SAR comparator 5. Look-up Table 1 can be modified to provide 4 more of the INL correction capacitors that can be coupled to each input, respectively, of comparator 5. Table 1 also can provide for different input voltage ranges. That is, the implementation of FIG. 6 is designed to work with different input voltage ranges in conjunction with different parts of a larger look-up table.

Figure 7:
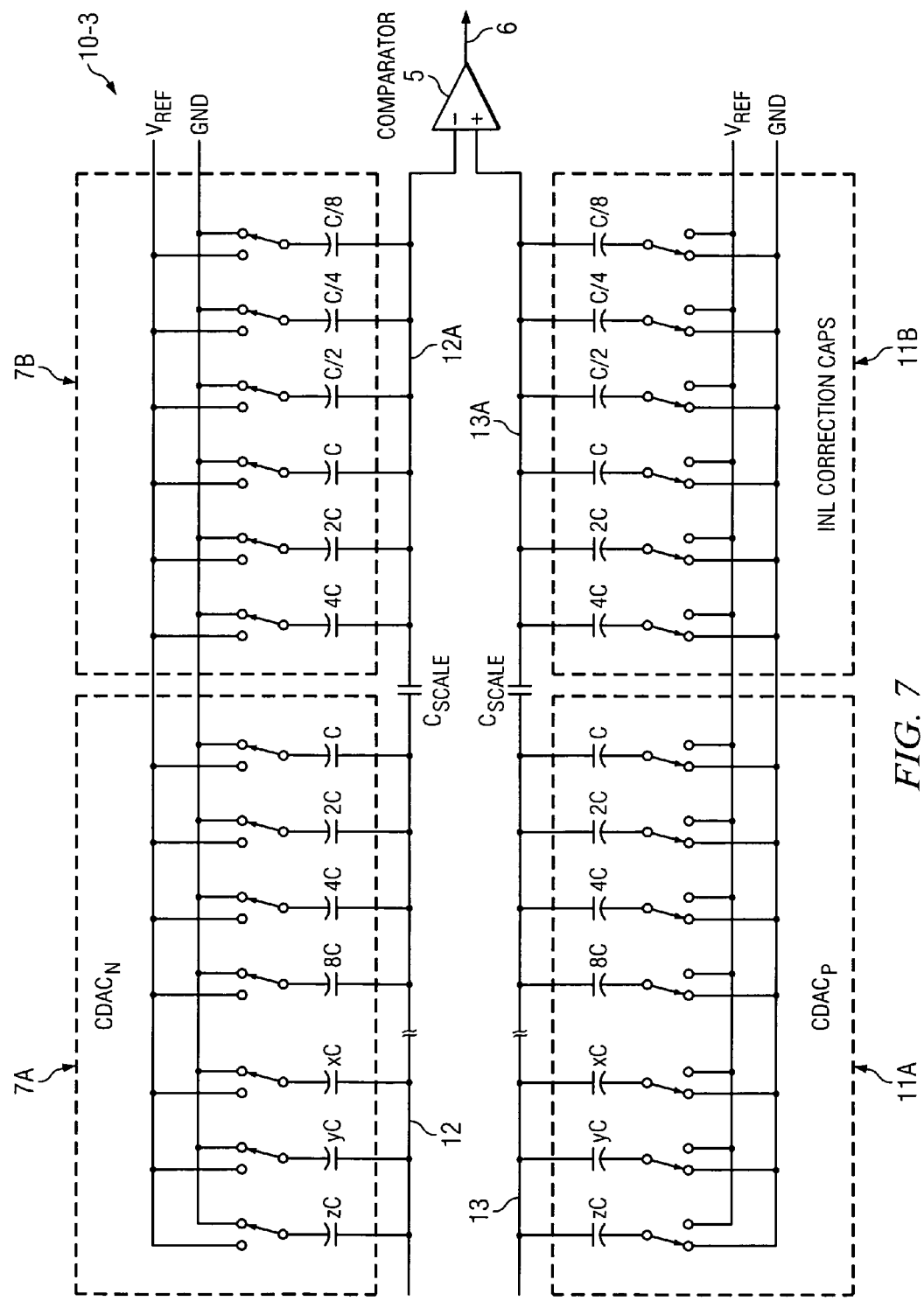
FIG. 7 is a schematic diagram of an implementation of the SAR ADC of FIG. 4 including 12 INL correction capacitors and 2 scaling capacitors.

In FIG. 7, SAR ADC circuitry 10-3 is the same as in FIG. 6 except that conductor 13 is connected to one terminal of a first scale-down capacitor of capacitance $C_{SCALE}$ having its other terminal connected by conductor 13A to the (+) input of comparator 5 and to the upper terminals of the INL correction capacitors in block 11B. Similarly, in circuitry 10-3 conductor 12 is connected to one terminal of a second scale-down capacitor of capacitance $C_{SCALE}$ having its other terminal connected by conductor 12A to the (−) input of comparator 5 and to the lower terminals of the INL correction capacitors in block 7B. The implementation of FIG. 7 can use a single look-up table and provide the necessary adjustments for various input voltage ranges by appropriately modifying the scale-down capacitors.

Figure 8:
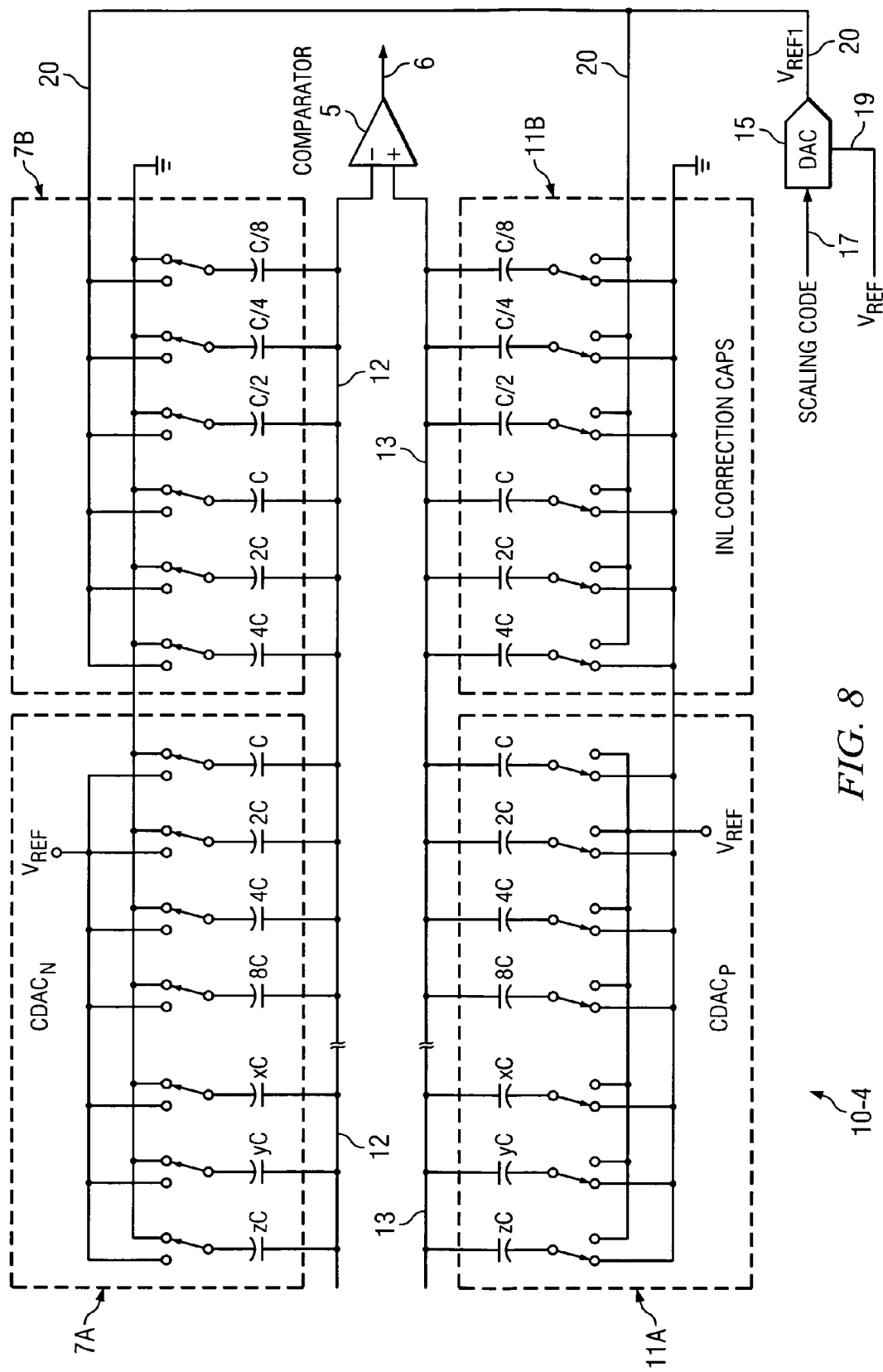
FIG. 8 is a schematic diagram of an implementation of the SAR ADC of FIG. 4 including 12 INL correction capacitors and a DAC (digital to analog converter) for generating a reference voltage for the CDACs and scaling capacitors in response to a scaling code.

In FIG. 8, SAR ADC circuitry 10-4 includes circuitry 10-2 in FIG. 6 and further includes a DAC 15 having its digital input 17 connected to receive a scaling code, labeled "SCALING CODE". DAC 15 has a reference voltage input 19 connected to receive the reference voltage $V_{REF}$. The output of DAC 15 is connected by conductor 20 to apply a scaled reference voltage $V_{REF1}$ to the reference voltage terminals of switches 32 in INL correction blocks 11B and 7B. The output of DAC 15 in FIG. 8 is a fixed voltage which is scaled on the basis of an expected range of the input voltage of the SAR ADC. A single look-up table can be used as described above for making the INL correction by switching various INL correction capacitors to the appropriate input of comparator 5. This is in contrast to the previously mentioned '965 patent, which uses a single INL correction capacitor and adjusts the output voltage of the auxiliary DAC so as to provide the needed INL correction, with the auxiliary DAC being the active component in making the INL correction (so the switching of INL correction capacitors is not the primary way of making the INL correction).

The described embodiments of the invention avoid the use of a complex mathematics engine and associated circuitry to compute various coefficients during the SAR ADC conversion, as required by the INL error correction system of the above mentioned '965 patent. Instead, the present invention provides a much simpler INL correction technique based on use of a look-up table to switch various INL correction capacitors in parallel with the binarily weighted CDAC capacitors in response to the a predetermined number of initial bit decisions of the SAR DAC conversion process. The look-up table determines which INL correction capacitors are required to adjust the CDAC outputs so as to correct the INL error without use of a complex math engine.

Although the INL correction technique of the present invention is not as precise as that described in the '965 patent because the present invention is based on a statistical average of INL error, the technique of the present invention avoids the complexity, cost, and slow speed of using a math engine and yet provides acceptable accuracy for most applications. Furthermore, final testing during manufacture of the SAR ADC's of the present invention is much less costly and much faster than is the case for the SAR ADCs of the prior art.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. For example, although differential embodiments of the invention have been described, the invention is equally applicable to a single ended embodiment (two of which are in essence included within each described differential embodiment). Furthermore, the weights of the corrective capacitors could also be scaled by a method other than binary weighting to customize the corrective response of the algorithm. Although multiple correction capacitors are included in the described embodiments, in some cases it might be practical to use just a single correction capacitor. It would be theoretically possible to have only one side of the comparator connected to a CDAC, with the other side being connected to a fixed reference voltage.

What is claimed is:

1. A SAR ADC comprising:
   (a) a first CDAC receiving a first analog input signal and including a plurality of CDAC capacitors each having a first terminal coupled to a first conductor;
   (b) a first correction capacitor circuit including a correction capacitor having a first terminal coupled to the first conductor;
   (c) a comparator having a first input coupled to the first conductor;
   (d) SAR logic circuitry having an input coupled to an output of the comparator and also having a first output bus coupled to control a plurality of switches coupled to second terminals of the capacitors of the first CDAC, respectively, for selectively coupling the second terminals of the capacitors of the first CDAC to either a first reference voltage or a second reference voltage, the SAR logic circuitry producing a digital signal representative of the first analog input signal; and
   (e) decoder circuitry having a first output bus coupled to control a switch coupled to a second terminal of the correction capacitor to selectively couple the second terminal of the correction capacitor to either the first reference voltage or a third reference voltage in response to stored INL error information so as to correct INL errors in a transfer characteristic of the SAR ADC.

2. The SAR ADC of claim 1 wherein the first correction capacitor circuit includes a plurality of the correction capacitors, and wherein the first output bus of the decoder circuitry is coupled to control a plurality of switches coupled to second terminals of the correction capacitors, respectively, of the first correction capacitor circuit.

3. The SAR ADC of claim 2 including a second CDAC receiving a second analog input signal and including a plurality of CDAC capacitors each having a first terminal coupled to a second conductor coupled to a second input of the comparator, the SAR ADC also including a second correction capacitor circuit including a plurality of correction capacitors each having a first terminal coupled to the second conductor, wherein the SAR logic circuitry has a second output bus coupled to control a plurality of switches coupled to second terminals of the capacitors of the second CDAC, respectively, for selectively coupling the second terminals of the capacitors of the second CDAC to either the first reference voltage or the second reference voltage, wherein the decoder circuitry has a second output bus coupled to control a plurality of switches coupled to the second terminals of the correction capacitors of the second correction capacitor circuit to selectively couple the second terminals of the correction capacitors of the second correction capacitor circuit to either the first reference voltage or the third reference voltage in response to the stored INL error information, wherein the SAR logic circuitry produces the digital signal to represent a difference between the first and second analog input signals.

4. The SAR ADC of claim 3 wherein the capacitors of the first and second CDACs are binarily weighted.

5. The SAR ADC of claim 3 wherein the correction capacitors of the first and second correction capacitor circuits are binarily weighted.

6. The SAR ADC of claim 3 wherein each of the first and second correction capacitor circuits includes two correction capacitors.

7. The SAR ADC of claim 3 wherein each of the first and second correction capacitor circuits includes 6 correction capacitors.

8. The SAR ADC of claim 7 wherein the first conductor is coupled to the first terminals of the capacitors of the first correction capacitor circuit and the first input of the comparator by means of a third conductor and a first scaling capacitor coupled between the first and third conductors, and wherein the second conductor is coupled to the first terminals of the capacitors of the second correction capacitor circuit and the second input of the comparator by means of a fourth conductor and a second scaling capacitor coupled between the second and fourth conductors.

9. The SAR ADC of claim 1 wherein the decoder is part of the SAR logic circuitry.

10. The SAR ADC of claim 9 wherein the digital signal is received by an output logic circuit to format the digital signal into a digital output signal of the SAR ADC.

11. The SAR ADC of claim 1 wherein the results of a predetermined number of initial bit decisions by the SAR logic are utilized by the decoder to access a look-up table to determine which of the correction capacitors are to be selectively coupled to the third reference voltage.

12. The SAR ADC of claim 11 including a digital to analog converter having an input coupled to receive a digital scaling signal for generating the third reference voltage.

13. The SAR ADC of claim 1 wherein the INL errors are caused primarily by voltage coefficients of the capacitors of the first and second CDACs.

14. The SAR ADC of claim 11 wherein the look-up table stores statistically determined INL correction information for the SAR ADC.

15. The method of claim 1 wherein the INL errors are caused primarily by voltage coefficients of the capacitors of the CDAC, the method including determining the INL error by subtracting an actual transfer function for the SAR ADC from an ideal transfer function for the SAR ADC.

16. The method of claim 1 including generating the third reference voltage by means of a digital to analog converter having an input coupled to receive a digital scaling signal.

17. A method for reducing INL error in a SAR ADC including
   a CDAC receiving an analog input signal, including a plurality of CDAC capacitors each having a first terminal coupled to a first conductor,
   a comparator having a first input coupled to the first conductor, and
   SAR logic circuitry having an input coupled to an output of the comparator and also having a first output bus coupled to control a plurality of switches coupled to second terminals of the capacitors of the CDAC, respectively, for selectively coupling the second terminals to either a first reference voltage or a second reference voltage, the SAR logic circuitry producing a digital signal representative of the input signal, the method comprising:
   (a) providing stored INL error information;

(b) coupling a first terminal of each of a plurality of correction capacitors in a correction capacitor circuit to the first conductor; and (c) controlling switches coupled to second terminals of each of the correction capacitors to selectively couple second terminals of the correction capacitors, respectively, to either the first reference voltage or a third reference voltage in response to the stored INL error information to correct INL errors in a transfer function of the SAR ADC.

18. The method of claim 17 including utilizing results of a predetermined number of initial bit decisions by the SAR logic circuitry to access a look-up table to determine which of the correction capacitors are to be selectively coupled to the third reference voltage.

19. The method of claim 18 including storing statistically determined INL correction information for the SAR ADC in the look-up table.

20. Circuitry for reducing INL error in a SAR ADC including a CDAC receiving an analog input signal, including a plurality of CDAC capacitors each having a first terminal coupled to a first conductor, a comparator having a first input coupled to the first conductor, and SAR logic circuitry having an input coupled to an output of the comparator and also having a first output bus coupled to control a plurality of switches coupled to second terminals of the capacitors of the CDAC, respectively, for selectively coupling the second terminals to either a first reference voltage or a second reference voltage, the SAR logic circuitry producing a digital signal representative of the input signal, the circuitry comprising:

(a) first correction capacitor means for coupling a first terminal of each of a plurality of correction capacitors in a correction capacitor circuit to the first conductor;

(b) means for storing INL error information; and (c) means for controlling switches coupled to second terminals of each of the correction capacitors to selectively couple second terminals of the correction capacitors, respectively, to either the first reference voltage or a third reference voltage in response to the stored INL error information to correct INL errors in a transfer function of the SAR ADC.

* * * * *